United States Patent [19]
Hsia et al.

[11] Patent Number: 5,993,227
[45] Date of Patent: Nov. 30, 1999

[54] TWO-STEP EJECTION MECHANISM

[75] Inventors: Chiu-Hui Hsia, Taipei; Chih-Chung Chu, Ping-Chen; Yu-Wen Chu, Yang Mei Town; Chan-Ming Hsu, Chung-Li, all of Taiwan

[73] Assignee: Berg Technology, Inc., Reno, Nev.

[21] Appl. No.: 08/923,879

[22] Filed: Sep. 2, 1997

[51] Int. Cl.⁶ .................................. H01R 13/62
[52] U.S. Cl. ............................................ 439/159
[58] Field of Search ...................... 439/159, 160

[56] References Cited

U.S. PATENT DOCUMENTS

| | | | |
|---|---|---|---|
| 5,536,180 | 7/1996 | Ishida et al. | 439/159 |
| 5,558,527 | 9/1996 | Lin | 439/155 |
| 5,573,413 | 11/1996 | David et al. | 439/157 |
| 5,575,669 | 11/1996 | Lin et al. | 439/157 |
| 5,597,316 | 1/1997 | David et al. | 439/159 |
| 5,599,197 | 2/1997 | Ishida et al. | 439/159 |
| 5,730,610 | 3/1998 | Hsia et al. | 439/155 |

FOREIGN PATENT DOCUMENTS

| | | |
|---|---|---|
| 219670 | 1/1994 | Taiwan . |
| 273312 | 3/1996 | Taiwan . |

*Primary Examiner*—Steven L. Stephan
*Assistant Examiner*—Barry M. L. Standig
*Attorney, Agent, or Firm*—Daniel J. Long; M. Richard Page

[57] ABSTRACT

A card connector for electrically coupling a PC card to an electrical device is provided. The card connector comprises a header section having a plurality of terminal pins disposed within the header section. A first and second elongated arm section are integrally coupled with the header section. Each one of the arms extend from a first end to a second end thereby forming a slot which is adapted to receive the PC card and guide the PC card into electrical contact with the terminal pins. A guide housing is securely disposed over said first arm. A push-rod is slidably mounted within the guide housing and adapted to move from a first position to a second position. A post is disposed within the guide housing. A swing arm is pivotally mounted on the push-rod and is adapted to engage and disengage with the post as the push-rod moves from the first position to the second position. A first spring is in communication with said swing arm. A second spring is biasingly disposed of within the guide housing in communication with the first spring. A rod is slidably mounted within the guide housing in communication with the push-rod. A link is movably coupled with the header in movable communication with the rod. The link is adapted to engage the PC card. The push-rod protrudes away from the first arm at the first position and is relatively flush with the first arm at the second position.

9 Claims, 8 Drawing Sheets

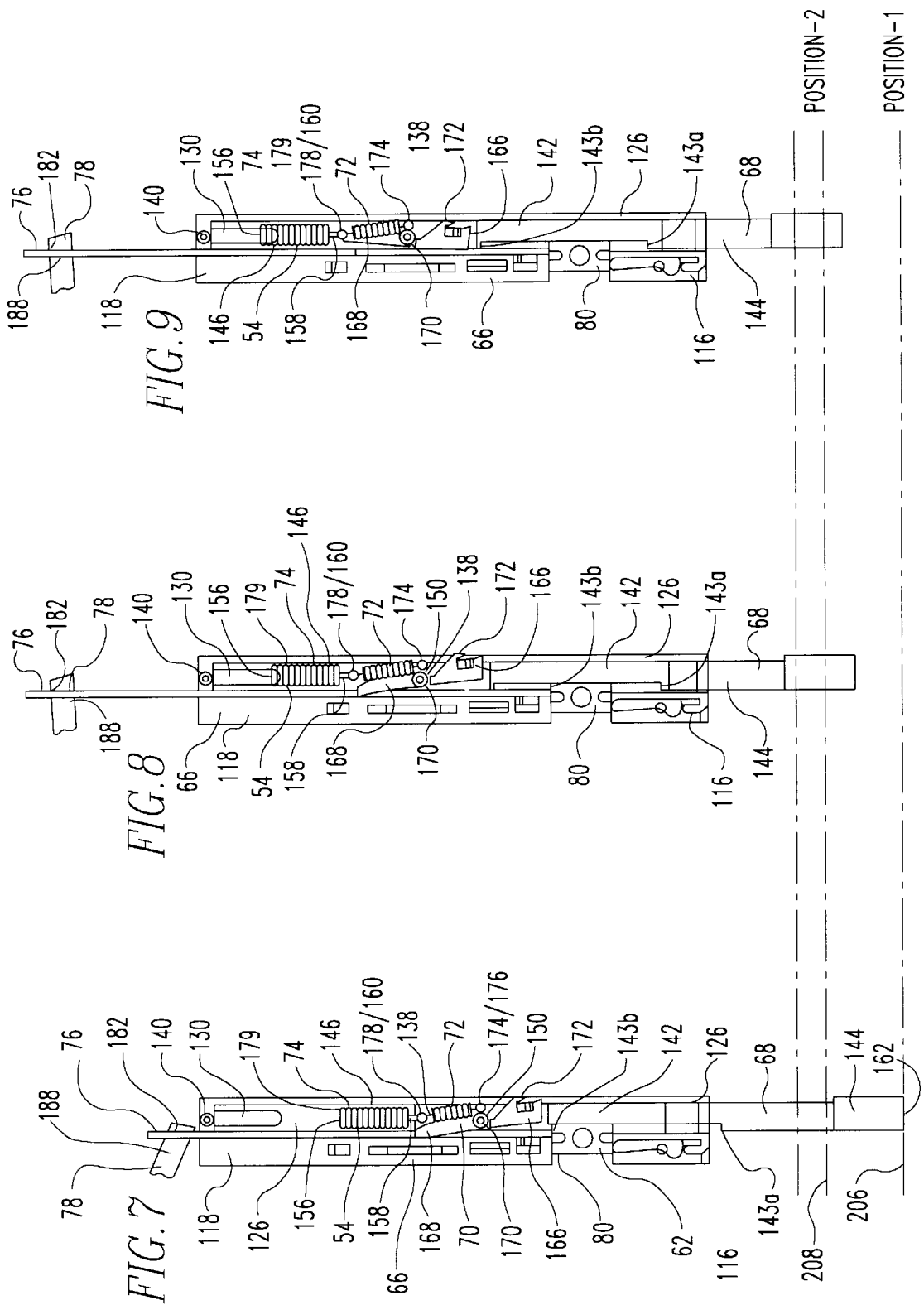

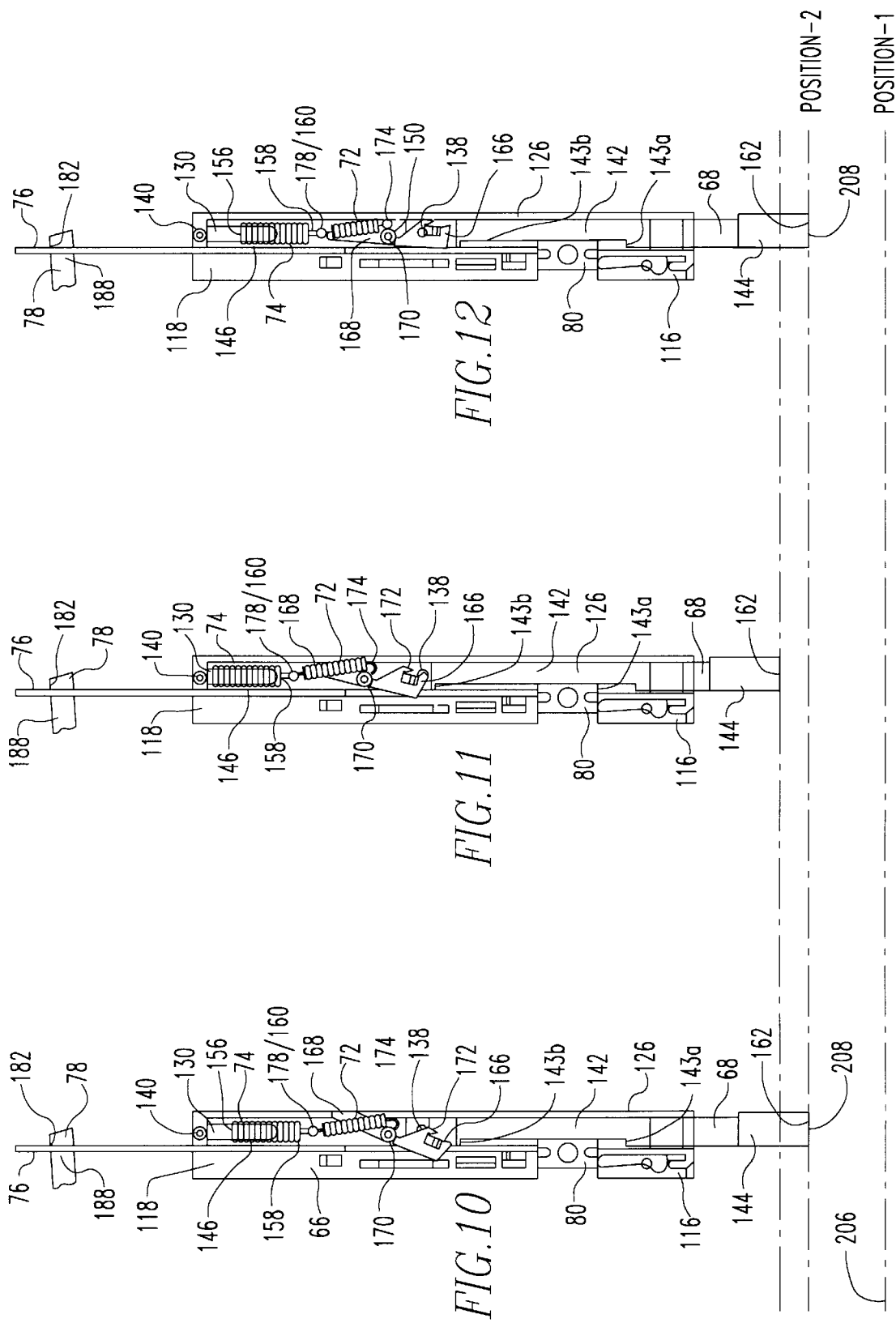

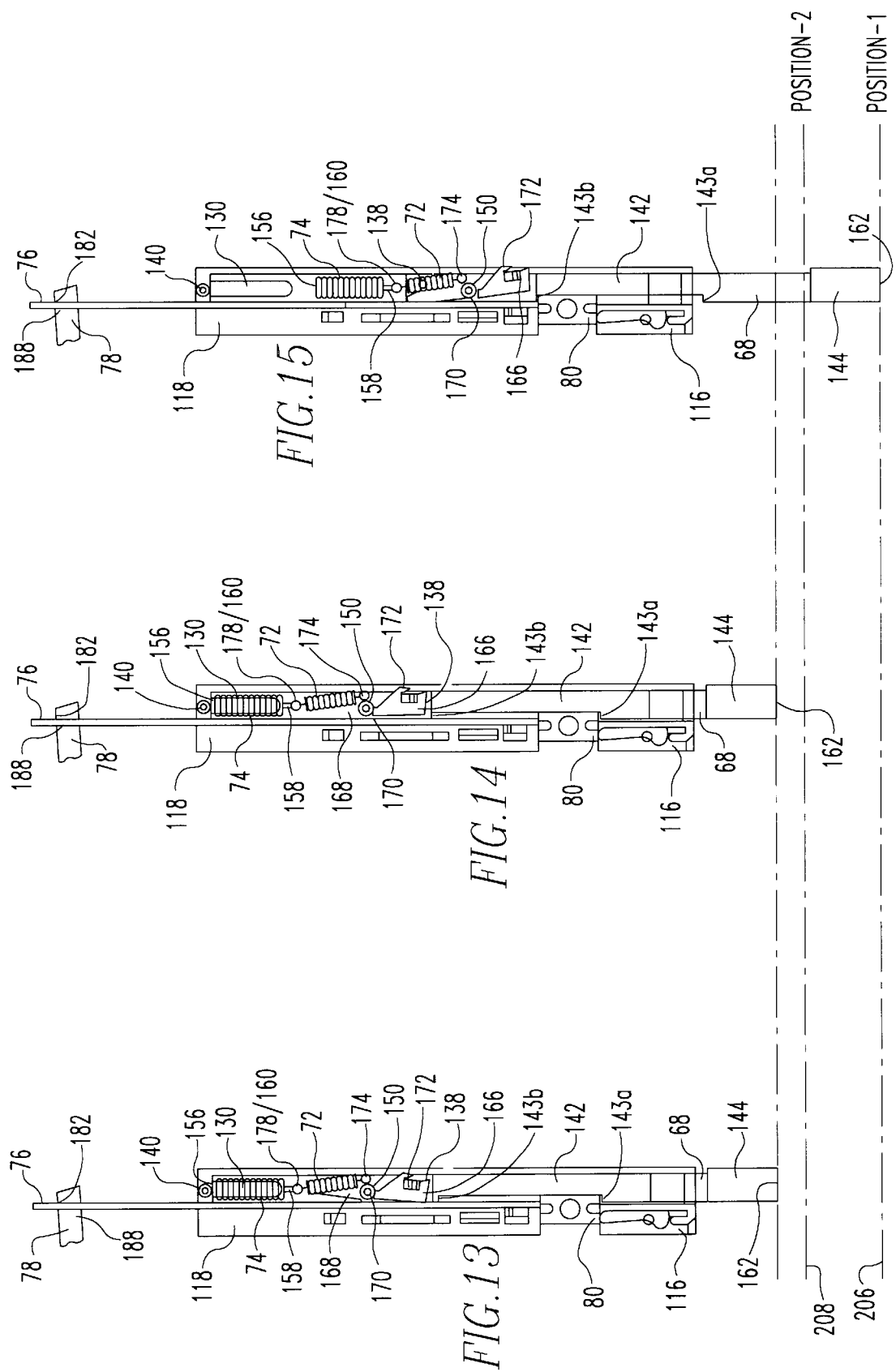

TWO-STEP EJECTION MECHANISM

FIELD OF THE INVENTION

The present invention relates to card connectors for electrically and mechanically coupling a PC card to an electrical apparatus, such as a computer and, more particularly, to a device for ejecting a PC card from the card connector.

BACKGROUND OF THE INVENTION

It is well known in the art that a variety of card connectors are available for electrically and mechanically coupling a PC card with computer systems, such as workstations, personal computers, and laptop and notebook computers. These card connectors are typically internal units that occupy a slot, or bay, in the computer system. Many card connectors are equipped with an ejection mechanism having a push-rod in communication with a linkage system for ejecting the PC card from the card connector and computer systems.

Laptop and notebook computers have relatively small bays in which to mount internal card connectors and other peripheral devices, as compared to the much larger bays available in most workstation and personal computer housings. The relatively small size of peripheral bays found in laptop and notebook computers, can place significant constraints on the designer of internal card connectors for use in such computers. Techniques that address and overcome the problems associated with these size constraints are therefore important.

Card connectors of the type that accept a removable PC card, such as a memory card, I/O card, and an 1.8 inch HDD card, have become increasingly popular. In order to provide a card connector for use in laptop and notebook computers, the size constraints of the peripheral bays of such computers must be considered. In particular, for an internal card connector to fit in the majority of laptop and notebook peripheral bays, the card connector may have to conform to the Personal Computer Memory Card Industry Association (PCMCIA) specifications. Specifically, the PCMCIA specifications suggest that a push-rod travel a maximum distance of 8mm along the card connector to eject the PC card from the card connector. The height of the card connector may also have to be in the range of 12 to 15 mm. These dimensions place many constraints on the design of such a card connector and ejection mechanism, and give rise to numerous design problems.

Several types of ejection mechanisms have been developed for card connectors. Several of these are "two-step" ejection mechanism as disclosed in U.S. Pat. No. 5,558,527, issued to Lin; U.S. Pat. No. 5,575,669, issued to Lin et al.; and U.S. Pat. No. 5,599,197 issued to Ishida et al. Generally, two-step ejection mechanisms have a body and a push-rod in communication with a linkage system. The push-rod is adapted to remain flush or hidden within the computer system during normal circumstances. When the user wishes to eject the card, however, it is necessary to manipulate the push-rod to protrude from the computer housing in order to actuate the linkage system to eject the card from the card connector. These types of ejection mechanisms, however, have several drawbacks.

One of these drawbacks with these types of ejection mechanisms is that they contain a relatively large number of components that must be designed within relatively close tolerances so that the assembled components may operate together. It would, therefore, be desirable to reduce the number of components that comprise an ejection mechanism for a card connector.

Another drawback of these types of ejection mechanisms is that they are relatively bulky and large and take-up valuable space within a laptop or notebook computer. It would, therefore, be desirable to provide an ejection mechanism for a card connector that is reduced in size.

SUMMARY OF THE INVENTION

A two-stage ejection device for a card connector is provided. The ejection device comprises a guide housing having a first end and second end with a channel extending therebetween. A push-rod is slidably mounted within the guide housing channel and adapted to move from a first position to a second position. A post is coupled with the guide housing in communication with the channel. A swing arm is pivotally mounted on the push-rod and adapted to engage and disengage from the post. An actuation member is provided to actuate the swing arm. A drive linkage is slidably mounted within the guide housing in communication with the push-rod. The drive linkage is adapted to engage the PC card, whereby, the push-rod protrudes away from the first arm at the first position and relatively flush with the first arm at the second position.

BRIEF DESCRIPTION OP THE FIGURES

FIGS. 7 through 15 are partial cut-out sideviews of the card connector and ejection assembly shown in FIG. 1 at various stages of the ejection assembly in operation to eject a PC card from the card connector.

DETAILED DESCRIPTION OF THE INVENTION

Figure 1:
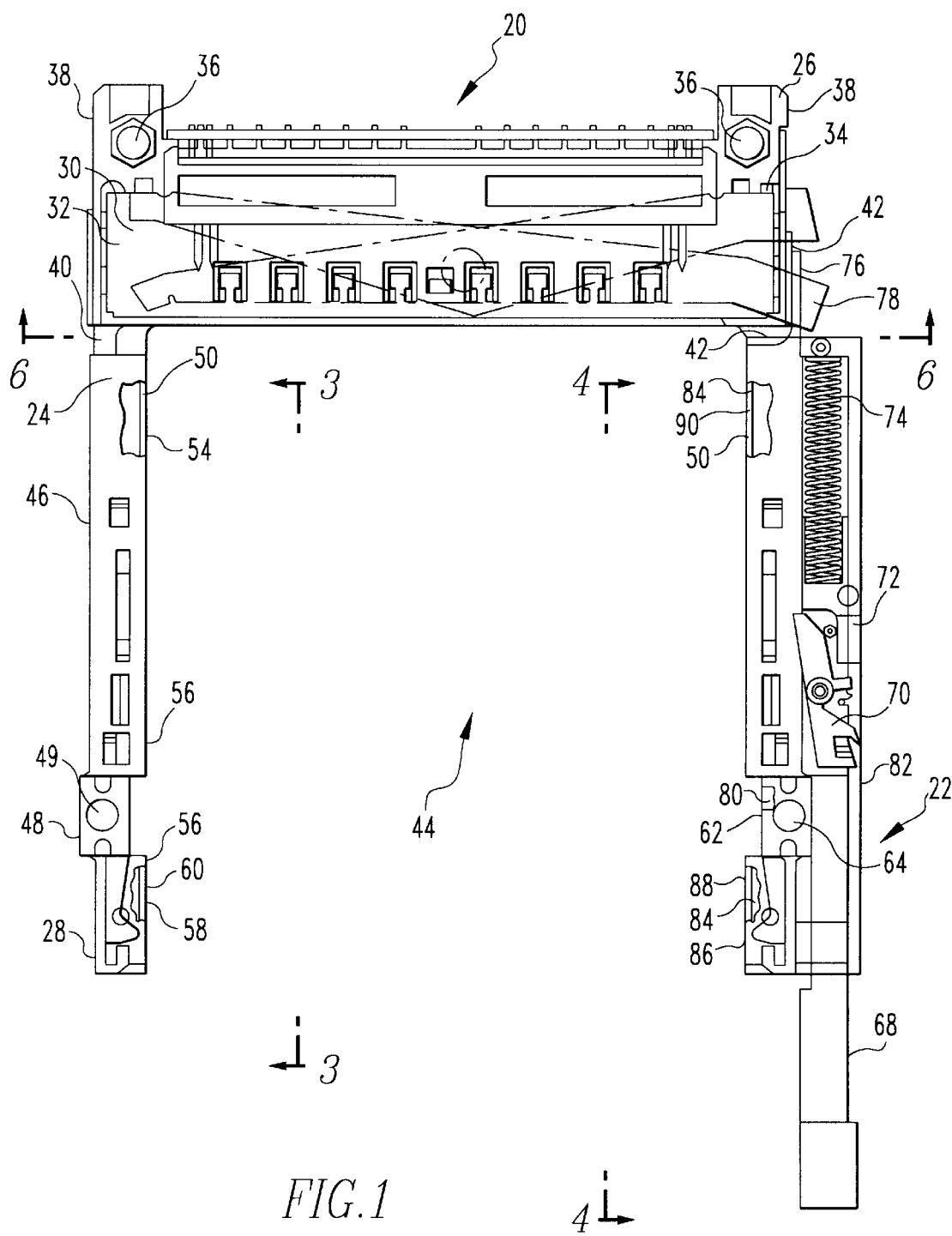
FIG. 1 is a planar view of a card connector and a partial cut-out view of an ejection assembly in accordance with the present invention.

The embodiment of the present invention will be explained below with references to the accompanying drawings. It is noted that the same reference numerals are used to identify like parts throughout the figures. FIG. 1 shows a card connector 20 mechanically coupled with an ejection assembly 22 in accordance with the present invention. The card connector 20 is adapted to be electrically coupled with a printed circuit board (PCB) (not shown). The card connector 20 has a first end 26 and second end 28. A header section 30 formed of an insulative material is located at the first end 26. The header section 30 may have a metal shield 32 on a surface thereof. A plurality of terminal pins 34 are received in the header in a relative width direction and are adapted to electrically connect with a PC card (not shown). A pair of holes 36 are provided proximate the edges 38 of the header section 30 for receiving fasteners (not shown) to mount the card connector to a PCB.

A pair of opposing elongated arm sections 40 and 42 extend from the edges 38 of the header section 30 and extend from the first end 26 to the second end 28 of the card connector 20. The arm sections 40 and 42 form a slot 44 through which the PC card can travel and mate with the terminal pins 34. It is preferable that the slot 44 be defined by substantially only the arm sections 40 and 42, and without a relative roof or relative floor. Some of the reasons for limiting the components that define the slot 44 is to provide open architecture for accepting different height packages in the connector. It is noted that a roof and/or floor may be provided to define a portion of the slot 44 if it is desired for another embodiment. It is preferable that the card connector be made from the least amount of material as possible to provide a strong, yet light weight, card connector. It is also preferable that the arm sections be detachable from the header.

The arm section 40 includes guide sleeve 46. The guide sleeve has a first grounding bracket 48 having a through-hole 49 coupled thereto. The grounding bracket 48 is also adapted to electrically couple with a grounding means on a PCB (not shown). The guide sleeve 46 is coupled with the arm section 40 by a lower plate 50.

The guide sleeve 46 has a relative outer wall 52 that is opposite the slot 44 and a relative inner wall 54 that is along one side of slot 44. A relative upper edge 56 and relative lower edge 58 extend slightly away from the inner wall 54 and towards the slot 44 to form a first guide groove 60. The first guide groove 60 is adapted to receive the edges of the PC card to guide the PC card along the length of the arm section 40, through the slot 44, and into electrical contact with the terminal pins 34. Additionally, the guide groove 60 is formed in part by portions of the lower plate 50.

The ejection assembly 22 is mechanically coupled to the arm section 42. The ejection assembly 22 comprises a guide housing 66, push-rod 68, swing arm 70, and actuation member, such as a small tension spring 72 and large compression spring 74; and a drive linkage, such as a rod 76 and link 78. The housing 66 is mechanically coupled on the arm 42. The push-rod 68 is slidably mounted within the guide housing 66. The guide housing 66 defines a stop 80 which is adapted to limit relative lateral sliding movement of the push rod 68 along the housing 66. A second grounding bracket 62 is disposed over the stop 80. The push-rod 68 is in communication with the rod 76 and link 78 to withdraw the PC card from the terminal pins 34 so that the PC card can be ejected from the card connector 20. It is noted that the actuation member may be almost any member that can actuate the swing arm 70. The ejection assembly 22 shown in FIG. 1 has the cover 124 (FIG. 5) removed to show parts of the assembly.

The guide housing 66 has a relative outer surface 82 that is opposite from the slot 44 and a relative inner surface 84 that is proximate the slot 44. A relative upper edge 86 and relative lower edge 88 extend slightly away from the inner surface 84 towards the slot 44 to form a second guide groove 90. The guide groove 90 is adapted to receive the edges of the PC card to guide the PC card along the length of arm 42, through the slot 44, and into electrical contact with the terminal pins 34. Additionally, the second guide groove 90 is formed in part by the plate 50 to guide the PC card to the terminal pins. It is noted that the guide housing may be integrally molded with the arm 42.

Figure 2:
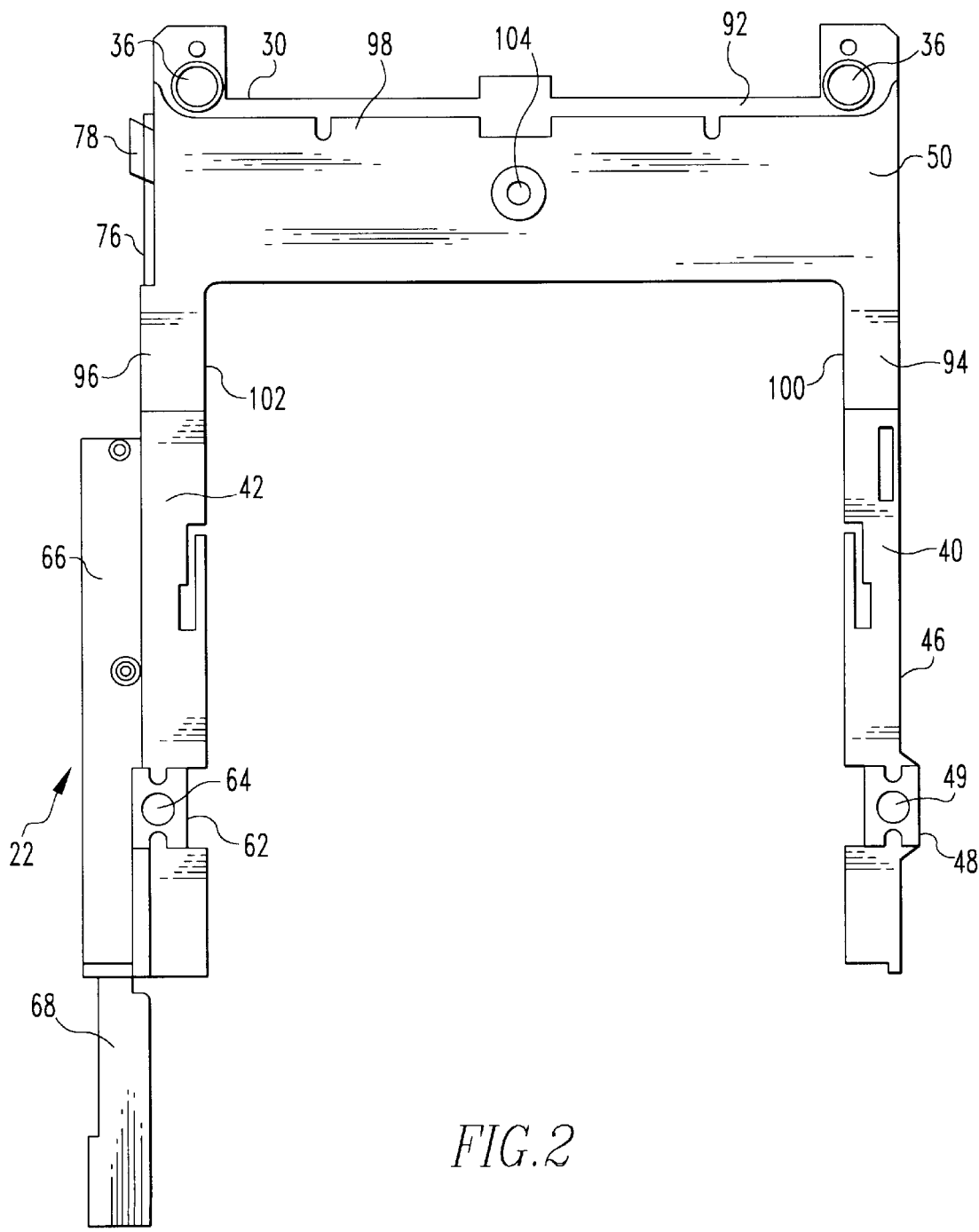
FIG. 2 is a bottom view of the card connector shown in FIG. 1.

FIG. 2 is a bottom view of the card connector 20. The plate 50 forms a substantial part of the bottom surface 92 of the card connector 20, mounting sleeve 46 and guide housing 66. The plate 50 has a head piece 98 located below the header section 30, a first integral extending leg 94 forming part of the first arm 40, and a second integral extending leg 96 forming a part of the arm section 42. The plate 50 is provided for securely maintaining the guide sleeve 46 and guide housing 66 in cooperation with each respective arm 40 and 42.

The first leg 94 of the plate 50 also provides a guide rail 100 that is in communication with the first guide groove 60 (not shown) and the second leg 96 forms a guide rail 102 that is in communication with the second guide groove 90 (not shown). Each one of the guide rails 100 and 102 are adapted to guide the inserted PC to the terminal pins 34. It is noted that the first arm 40 can be formed to define the guide groove rather than requiring the separate sleeve 46.

FIG. 1 also shows the link 78 pivotally mounted, preferably with a rivet 104, to the head piece 98 (FIG. 2). The link 78 is positioned such that it is in communication with the rod 76 when the entire ejection assembly 22 is coupled to the card connector 20. The way that the link 78 and rod 76 communicate with one another is discussed in more detail below.

Figure 3:
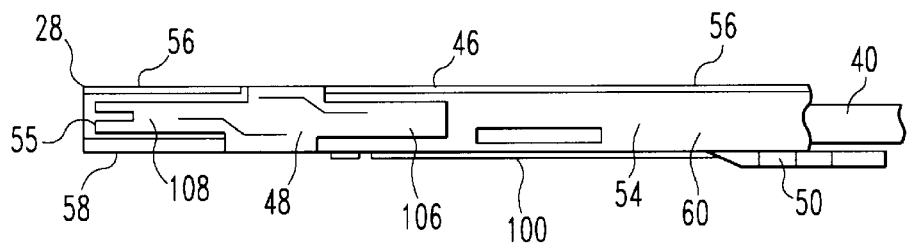
FIG. 3 is a sectional view taken along line 3—3 shown in FIG. 1 to illustrate a guide groove that is adapted to communicate with a PC card.

FIG. 3 is a sectional view taken along section line 3—3 shown in FIG. 1 to illustrate the first arm 40, guide sleeve 46, and first grounding bracket 48 in more detail. The first grounding bracket 48 is positioned proximate the second end 28 of the card connector 20. The first grounding bracket 48 is mounted with a fixed end 106 that is substantially flush along the inner wall 54 of the guide sleeve 46, and a free end 108 that is free to deflect within a cavity 55 defined by the inner wall 54 when the PC card is inserted into the guide groove 60 to assist in guiding the card connector to the pins 34 and electrically coupling the PC card and grounding traces on a PCB. The guide groove 60 is comprised of the upper edges 56 and lower edges 58 of the guide sleeve 46 and the guide rail 100 of the plate 50.

Figure 4:
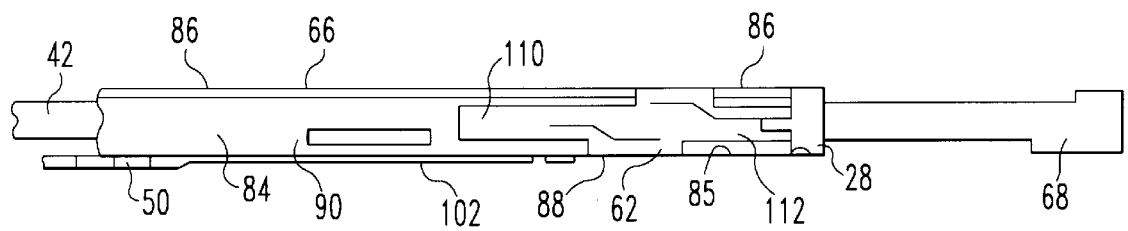
FIG. 4 is a sectional view taken along line 4—4 shown in FIG. 1 to illustrate a guide groove on the ejection assembly that is adapted to communicate with a PC card.

FIG. 4 is a sectional view taken along section line 4—4 shown in FIG. 1 to illustrate the second arm 42, guide housing 66, and second grounding bracket 62 in more detail. The second grounding bracket 62 is positioned proximate the second end 28 of the card connector 20. The second grounding bracket 62 is mounted with a fixed end 110 that is substantially flush along the inner wall 84 of the guide housing 66, and a free end 112 that is free to deflect within a cavity 55 defined by the inner wall 84 when the PC card is inserted into the guide groove 90 to assist in guiding the card connector to the pins 34 and electrically couple with the PC card and grounding traces on a PCB. The guide groove 90 is comprised of the upper edges 86 and lower edge 88 of the guide housing 66, and the guide rail 102 of the plate 50.

Figure 5:
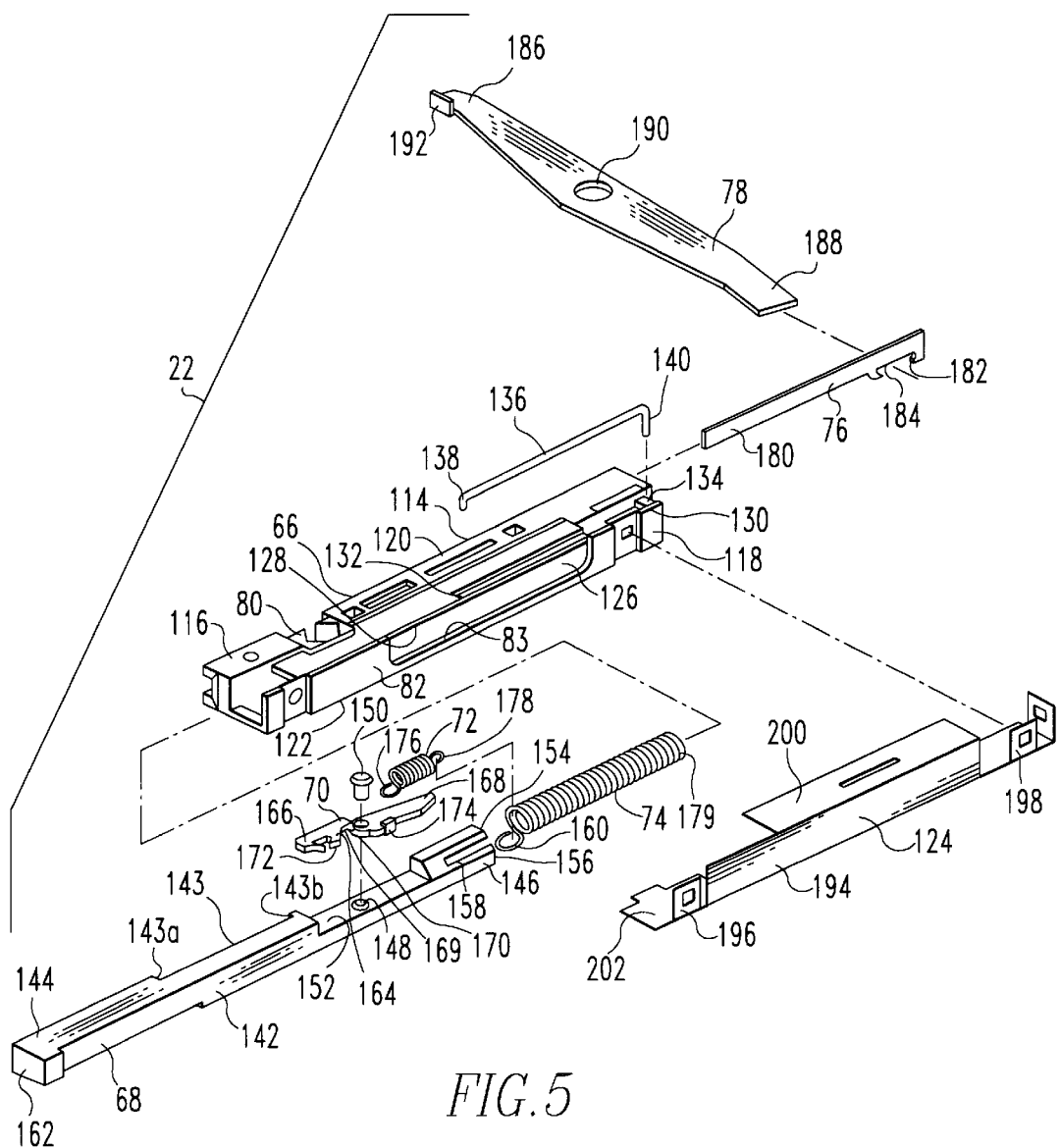
FIG. 5 is an exploded view of the ejection assembly shown in FIG. 1.

FIG. 5 is an exploded view of the ejection assembly 22. The guide housing 66 is adapted to slidably receive the push-rod 68, swing arm 70, small tension spring 72 and large compression spring 74. The outer wall 82 of the guide housing 66 is shown, but the inner surface 84 is not. The outer wall 82 defines a cut-out section 83 that extends for the substantial length of the outer wall 82 and enables the swing arm 70 to operate therein. In addition to the outer wall 82, the guide housing 66 has an elongated sidewall 114 having a proximal end 116, distal end 118, an upper portion 120 and bottom portion 122. The upper portion 120 and bottom portion 122 are adapted to securely receive a cover 124 to cover the other ejection assembly components in their relative operating positions.

The upper portion 120 and outer wall 82 define a channel 126 that extends from the proximal end 116 of the elongated sidewall 114 to the distal end 118. The channel 126 is adapted to extend along section 42 and secured thereto. The channel 126 has a relative ceiling portion 128 but no floor portion. It is noted that a floor portion can be provided for other embodiments.

Preferably, the channel 126 has a cross-section that is adapted to slidingly receive the push-rod 68. More preferably, the channel 126 has a generally rectangular cross-section that is adapted to slidingly receive the push-rod 68 having a similar cross-section. The width of the channel 126 is wide enough to enable the swing arm 70 to pivotally move within the channel and in communication with the cut-out section 83, and for the small tension spring 72, large compression spring 74 and the rod 76 to be positioned therein. The channel 126 is adapted to movably retain the rod 76 in communication with the link 78. The way that the push-rod 68, swing arm 70, and rod 76 communicate within the channel 126 is discussed in more detail below.

An end wall 130 is positioned at one end of the channel 126. The end wall 130 is adapted to maintain the large compression spring 74 in spring biasing communication with the push-rod 68. The way that the small tension spring 72, push-rod 68, and large compression spring 74 communicate with each other is discussed in more detail below.

A pair of holes 132 and 134 are formed in the upper portion 120 of the elongated sidewall 114 and are adapted to securely receive a spring rod 136 having a first moveable end 138 and second fixed end 140. The first hole 132 is located proximate the proximal end 116 of the elongated sidewall 114, and the second hole 134 is located proximate the distal end 118 of the elongated sidewall 114. The first hole 132 extends from the upper portion 120 of the elongated sidewall 114 to the channel 126. The first hole 132 is adapted to receive the first end 138 such that a portion of the first end 138 protrudes into the channel 126 like an extending post to movably engage the swing-arm 70. The way that the spring rod communicates with the swing-arm 70 is discussed in more detail below.

The push-rod 68 has an elongated body 142 having a proximal end 144 and distal end 146. The elongated body 142 is adapted to pivotally receive the swing arm 70 and small tension spring 72 proximate the distal end 146 of the elongated body 142. It is preferable that the swing arm 70 be attached with a rivet 150 that is received in a hole 148.

More preferably, the elongated body 142 is formed with a depression 152 in which the swing arm 70 and small tension spring 72 are mounted. The depression 152 is formed at a sufficient depth and length to enable the swing arm 70, small tension spring 72, and rivet 150 to be mounted on the push-rod 68 such that after the push-rod 68 is positioned in and slides along the channel 126, the swing arm 70 can pivot and move slightly up and down in the relative longitudinal direction within the channel 126 without contacting the ceiling portion 128 of the channel 126. The operation of the swing arm 70 is discussed in more detail below.

Preferably, the elongated body 142 has a cross-sectional area that is similar to the cross-sectional area of the channel 126 and adapted to slidably mount therein. More preferably, the elongated body 142 has a generally rectangular cross-section. The elongated body 142 also defines an indentation 143 between the proximal 144 and distal 146 ends of the push-rod 68. The indentation 143 has edges 143a and 143b which are adapted to engage the stop 80 to limit the relative lateral movement of the push rod 68 along the channel 126.

The distal end 146 of the elongated body 142 defines a bore 154 that is adapted to receive a portion of the large compression spring 74. Preferably, the bore 154 has an open end 156 and a slit 158. The bore 154 is adapted to securely receive the head 160 of the large compression spring 74 extending at least partially through the slit 158. Conveniently, the head 160 of the large compression spring 74 can couple with the tail 178 of the tension spring to retain the end 178. It is noted that the bore 154 can be formed in almost any shape that can receive a spring.

The proximal end 144 of the elongated body 142 defines a tip portion or push-button 162 that is generally wider than the width of the rest of the elongated body 142 to enable a user to more easily manipulate the push-rod 68 to actuate the other components of the ejection assembly 22 to eject a PC card from the card connector 20.

Figure 5A:
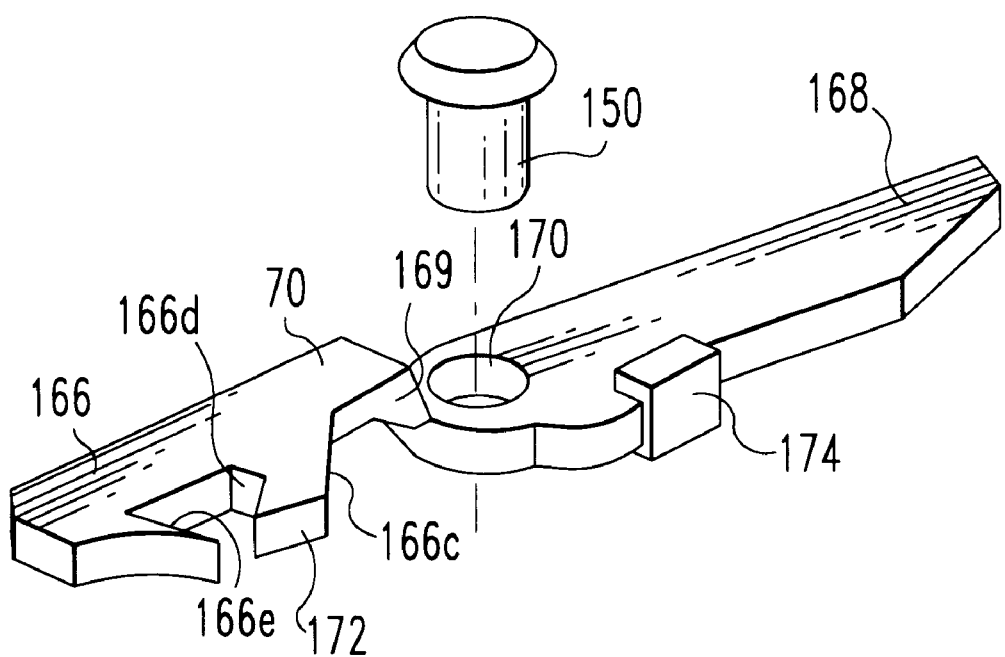
FIG. 5a is a perspective view of a swing arm in accordance with the present invention.

The swing arm 70 (also shown in FIG. 5a) has a body 164 that defines a first end 166, second end 168, and an aperture 170 therebetween. A tooth 172 extending at an acute angle relative to the first end 166 proximate the aperture 170 is adapted to engage the first end 138 of the spring rod and to form a notch 166d in the swing arm 70 for receiving the first end 138 of the spring arm. The first end 166 is slightly raised above the second end 168 by a neck portion 169. An upwardly protruding stump end 174 is located proximate the aperture 170 and is adapted to receive one end of the small tension spring 72.

The small tension spring 72 has a head portion 176 and tail portion 178. The small tension spring 74 is adapted to be maintained in a fixed position within the channel 126 to bias the awing arm 68 in a counter-clockwise rotation relative to the orientation shown in FIG. 5. Preferably, the head portion 176 is adapted to securely mount on the stump end 174 and bias the swing arm 70 within depression 152. Additionally, the tail portion 178 of the small tension spring is adapted to be coupled with the head portion 160 of the large compression spring 74.

The rod 76 has a proximal end 180 and distal end 182. The proximal end 180 of the rod is adapted to be slidably received in channel 126 along the distal end 146 of the push-rod 68. The distal end 182 defines a slot 184 that is adapted to receive end 188 of the link 78.

The link 78 has a first end 186 and second end 188 with a hole 190 therebetween. The first end 186 is adapted to eject a PC card from the card connector 20. Preferably, the first end 186 defines a relatively flat face portion 192 that is adapted to movably engage a PC card. The second end 188 of the link is adapted to fit within the slot 184 of the rod 76. Preferably, the hole 190 is adapted to receive a member, such as a rivet 104, to pivotally mount the link 78 on the plate 50.

The cover 124 has a body portion 194 having a first end 196 and second end 198. A top portion 200 and bottom portion 202 are located between the first 196 and second ends 198. The top portion 200 is adapted to securely engage the upper portion 120 of the guide housing 66, and the lower portion 202 of the cover is adapted to securely engage the bottom portion 122 of the guide housing 66 such that the cut-out section 83 of the guide housing 66 is covered.

Figure 6:
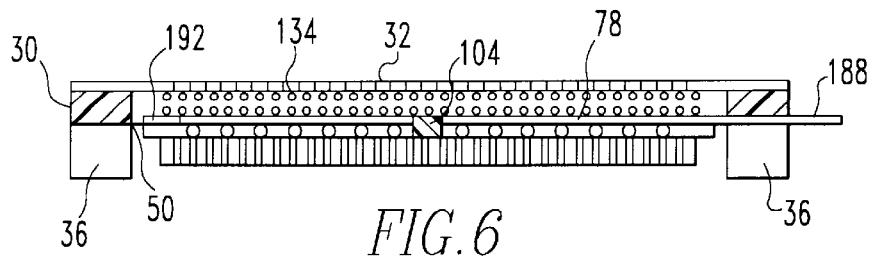
FIG. 6 is a sectional view taken along section line 6—6 in FIG. 1 to illustrate the way that a link is position within the card connector.

FIG. 6 is a cross-sectional view taken along section line 6—6 shown in FIG. 1 and illustrates the header 30, plate 50 and link 78 in more detail. The terminal pins 34 are displaced along the width of the header 30. A plurality of solder points (not shown) are provided for electrically coupling the pins 34 to the PCB on which connector 20 is mounted. The face portion 192 of link 78 is positioned to engage and eject a PC card from the card connector 20. The second end 188 of the link extends beyond one of the header edges 38.

The operation of the card connector 20 and ejection assembly 22 will now be discussed in conjunction with FIGS. 7 through 15. FIGS. 7 through 13 illustrate how the push-rod 68 is manipulated to move the push-rod 68 from a first protruding position 206 to a relative second position 208 where the push-rod 68 remains substantially flush with the computer to avoid the unintentional ejection of a PC card. FIGS. 14 and 15 illustrate movements of the push-rod 68 out of the flush second position 208 back to the first protruding position 206 to eject the PC card from the card connector. It is noted that the entire spring rod 136 is not shown in FIGS. 7 through 15 for clarity purposes, and only the first end 138 and second end 140 of the spring rod are shown.

In FIG. 7 a PC card is inserted into the card connector 20 and in electrical communication with a computer. All of the ejection assembly components are at a relative first position 206. In the first position 206, the proximal end 144 of the push-rod 68 protrudes away from the card connector 20. The guide housing 66 is displaced around the arm section 42 (not shown). The rod 76 is slidably positioned within the channel 126 with the second end 182 of the rod 76 movably mounted to the second end 188 of the link 78. The first end 138 of the spring rod is positioned through the first hole 132 in communication with the channel 126, and the second end 140 of the spring rod is positioned within the second hole 134. The head 176 of the small tension spring 72 is mounted with the stump end 174 of swing arm 70. The head 160 of the large compression spring 74 is positioned within the push-rod bore 156 and partially extending through the slit 158. Preferably, the head 160 of the large compression spring 74 and the tail portion 178 of the small tension spring 72 are coupled together to mount the tail portion 178.

After the small tension spring 72 is coupled with the swing arm 70 and large compression spring 74, the small tension spring 72 is maintained at fixed position and applies a constant tension force on the swing arm 70, thereby, biasing the swing arm 70 in a relative counter-clock wise direction about the rivet 150. The swing arm 70 is prevented from rotating further about the rivet 150 when the tail end 168 of the swing arm 70 contacts the inner surface 54 of the guide housing 66. In this position of push-rod 68, the swing arm 70 does not engage the first end 138 of the spring rod.

The push-rod 68 and mounted components are positioned within the guide housing channel 126 with the distal end 146 of the push-rod proximate the distal end 118 of the guide housing 66. The second end 179 of the large compression spring 74 engages the end wall 130. The cover 124 (not shown) is disposed over the guide housing upper portion 120 and bottom portion 122, thereby covering the cut-out section 83 in the guide housing 66. The end surface 168a of the swing arm 70 engages the end 180 of rod 76. As push rod 68 is pushed inwardly by the user, rod 76 moves forwardly to rotate the link 78 to eject the card.

In FIGS. 8 through 10, the push-button 162 is traveling towards the second position 208, thereby, urging the elongated body 142 of the push-rod 68 along the channel 126 towards the distal end 118 of the guide housing 66. As the push-button 162 moves towards the second position 208, the distal end 146 of the push-rod 68 communicates with and, applies a compressive force to, the large compression spring 74 in the direction of distal end 118 of the guide housing 66. As the push-button 162 moves towards the distal end 118 of the guide housing 66, the first end 138 of the spring rod passes over the central portion of the swing arm 70 where pivot 150 is located. As the push-button 162 continues towards the second position 208, the first end 138 of the spring rod engages the raised side cam surface 166c, thereby driving the swing arm 70 in a relative clock-wise direction towards the inner surface 54 of the guide housing against the action of spring 72. As the end 166 of swing arm 70 moves towards the inner surface 54, the tail end 168 of the swing arm 70 rotates in a relative clock-wise direction away from the inner surface 54 of the guide housing 66 and out of engagement with the end of rod 76.

In FIG. 11, the push-button 162 continues traveling towards the distal end 118 of the housing, and in turn, continues to apply a compressive force on the large compression spring 74. Additionally, the small tension spring 74 continues biasing the swing arm 70 in counter-clockwise rotation about the rivet 150. Eventually, the first end 138 of the spring rod passes the tooth 172 as the push-rod 68 continues towards the distal end 118 of the guide housing 66. After the tooth 172 is passed the first end 138 of the spring rod, the small tension spring 72 biases the swing arm 70 in a relative counter-clockwise rotation such that the notch 166d receives the first end 138 of the spring rod. At this point, the edge 143a of the push-rod 68 contacts the stop 80, thereby, signaling to the user to cease applying pressure on the push-button 162. Once the user ceases applying pressure to the push-button 162, the large compression spring 74 decompresses and abuts the distal end 146 of the push-rod 68, thereby, biasing the push-rod towards the proximal end 116 of the guide housing 66 until the first end 138 of the spring rod is locked in the notch 166d. With the first end 138 of the spring rod locked in notch 166d, the push-button 162 is maintained at the second position 208 relatively flush with the computer, as shown in FIG. 12.

In FIGS. 13 and 14, the push-rod 68 is manipulated to disengage the swing arm 70 from the first end 138 of the spring rod and return the push-button 162 back to the first position 206. An initial force is applied to the push-button 162 in the direction of the distal end 118 of the guide housing 66. As the force is applied to the push-button 162, the elongated body 142 continues traveling along the channel 126 such that the first end 138 of the spring rod engages the vertical cam surface 166e, thereby, pushing the first end 138 of the spring rod upward. As the first end 138 of the spring rod is forced out of notch 166d, the small tension spring 72 biases the swing arm 70 in the counter-clockwise direction such that the tail end 168 of the swing arm 70 moves in the direction of the inner surface 54 of the guide housing 66.

As the push-rod's 68 elongated body 142 continues to travel towards the distal end 118 of the guide housing 66, the push-rod's indentation edge 143a contacts the stop 80, thereby, signaling the user to cease applying a force to the push-rod. After the user ceases applying a force to the push-button 162 with the first end 138 of the spring rod out of notch 166d, the large compression spring 74 can urge push-rod 68 back towards its original first position 206.

In FIG. 15, the large compression spring 74 has forced the push-rod's indentation edge 143b into engagement with the stop 80, thereby, maintaining the push-button 162 at the first position 206. In this position, the push-rod is ready to be pushed back towards the distal end 118 of the guide housing 66 with swing arm 70 positioned to engage to the rod 76 and actuate link 78. As the link 78 is actuated, the face portion 192 disengages the PC card from the terminal pins and forces a part of the PC card from the slot 44. The user may then withdraw the PC card from the card connector.

It is to be understood that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

We claim:

1. A card connector for electrically coupling a PC card to an electrical device, said card connector comprising:

a header section having a plurality of terminal pins disposed within the header section;

a first and second elongated arm section integrally coupled with the header section, each one of said arms extending from a first end to a second end thereby forming a slot which is adapted to receive the PC card and guide the PC card into electrical contact with the terminal pins;

a guide housing securely disposed over said first arm;

a push-rod slidably mounted within the guide housing, said push-rod adapted to move from a first position to a second position;

a post disposed within the guide housing;

a swing arm pivotally mounted on said push-rod, said swing arm adapted to engage and disengage with the post as the push-rod moves from the first position to the second position;

an actuation member comprising a first and a second spring connected to the swing arm and, wherein said first and second springs each have opposed ends and the first spring is connected at one of its ends to the push rod and at the other one of its ends to one end of the second spring and the second spring is connected at its other end to swing arm to bias the swing arm so that said first and second springs are adapted to actuate the swing arm;

a drive linkage slidably mounted within said guide housing and connected to said push-rod, said drive linkage adapted to engage the PC card, whereby said push-rod protrudes away from said first arm at the first position and relatively flush with the first arm at said second position.

2. The connector in claim 1 wherein the guide housing further comprises:

a relative outer wall opposite said slot;

a relative inner wall proximate the slot;

a relative upper edge extending away from said inner wall towards the slot;

a relative lower edge extending away from the inner wall towards the slot, wherein said upper edge and lower edge form a first guide groove that is adapted to communicate with an edge of the PC card to guide the PC card along the length of the slot into electrical contact with the terminal pins.

3. The card connector in claim 2 further comprising:

a guide sleeve securely mounted to the second arm, said guide sleeve having a relative outer wall opposite the slot, and a relative inner wall proximate the slot, a relative upper edge and relative lower edge extend away from the inner wall and towards the slot to form a second guide groove, said guide groove adapted to communicate with an edge of the PC card to guide the PC card along the slot and into electrical contact with the terminal pins.

4. The card connector in claim 3 further comprising:

a plate mechanically coupled with the header, guide housing, and guide sleeve, said bottom bracket connected with the first and second guide grooves to guide the PC card to and from the terminal pins.

5. The card connector in claim 1 wherein said swing arm further comprises:

a first end, second end, tooth extending at an acute angle relative to said first end, and stump end extending at an upward direction relative to said first end, said first end and tooth adapted to engage and disengage from said pin end, said stump end adapted to communicate with the first spring to pivot the swing arm along the push-rod.

6. A two-stage ejection device for a card connector, said ejection device comprising:

a guide housing having a first end and second end with a channel extending therebetween;

a push-rod slidably mounted within the guide housing channel and adapted to move from a first position to a second position;

a post coupled with the guide housing and positioned in the channel;

a swing arm pivotally mounted on the push-rod and adapted to engage and disengage with the post;

an actuation member in communication with the swing arm and adapted to actuate the swing arm; and a drive linkage slidably mounted within said guide housing and connected to said push-rod, said drive linkage adapted to engage the PC card, whereby said push-rod protrudes away from said first arm at the first position and relatively flush with the first arm at said second position.

7. The ejection device in claim 6 wherein said guide housing further comprises:

a relative outer wall disposed along the channel;

a relative inner wall disposed along the channel;

a relative upper edge extending away from said inner wall;

a relative lower edge extending away from the inner wall, wherein said upper edge and lower edge form a first guide groove that is adapted to be connected with an edge of the PC card to guide the PC card into electrical contact with an electrical component.

8. The ejection device in claim 7 wherein said swing arm further comprises:

a first end, second end, tooth extending at an acute angle relative to said first end, and a stump end extending at an upward direction relative to said first end, said first end and tooth adapted to engage and disengage from a pin end, said stump end adapted to be connected with said first spring to pivot the swing arm along the push-rod.

9. The ejection device in claim 6 wherein said actuation member includes:

a first spring movably coupled with the swing arm; and a second spring biasingly mounted and within the channel connected to the first spring.

* * * * *